US 7,851,799 B2

(12) United States Patent
Song et al.

(10) Patent No.: US 7,851,799 B2
(45) Date of Patent: Dec. 14, 2010

(54) THIN FILM TRANSISTOR SUBSTRATE (75) Inventors: Moo-Hyoung Song, Daegu (KR);
Sung-Jin Hong, Seoul (KR);
Seoung-Jin Park, Daegu (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/003,765

(22) Filed: Dec. 31, 2007

(65) Prior Publication Data

US 2008/0179595 A1 Jul. 31, 2008

(30) Foreign Application Priority Data

Jan. 30, 2007 (KR) .................. 10-2007-0009662

(51) Int. Cl.
*H01L 29/04* (2006.01)
*H01L 31/20* (2006.01)
*H01L 31/036* (2006.01)
*H01L 31/0376* (2006.01)

(52) U.S. Cl. ................... 257/59; 257/72; 257/347; 257/E27.06; 257/E27.515

(58) Field of Classification Search ............ 257/59–72, 257/347, E27.06, E27.515, E27.111
See application file for complete search history.

(56) References Cited

U.S. PATENT DOCUMENTS

| 6,256,076 | B1 | 7/2001 | Bae et al. ............... 349/38 |
| 7,023,017 | B2 | 4/2006 | Ahn et al. ............... 257/59 |
| 7,556,988 | B2 | 7/2009 | Ahn et al. ............... 438/128 |
| 2006/0231838 | A1* | 10/2006 | Kim ..................... 257/59 |

FOREIGN PATENT DOCUMENTS

CN  1614487  11/2005

* cited by examiner

*Primary Examiner*—Cuong Q Nguyen
*Assistant Examiner*—Cathy N Lam
(74) *Attorney, Agent, or Firm*—Morgan, Lewis & Bockius LLP (57) ABSTRACT

A thin film transistor (TFT) substrate includes: a plurality of gate wirings; a plurality of data wirings insulatedly crossing the gate wirings to define a plurality of pixels; a plurality of common voltage lines formed along edges of pixels and mutually connected in an extending direction of the gate wirings; and a plurality of common electrodes formed at the pixel such that the plurality of common electrodes partially overlap with the common voltage line and mutually connected in an extending direction of the data wirings. A uniform common voltage can be stably applied on the entire surface of the TFT substrate.

10 Claims, 6 Drawing Sheets

THIN FILM TRANSISTOR SUBSTRATE

BACKGROUND OF THE INVENTION

1. Field of the Invention

The present invention relates to a thin film transistor substrate applied for a display device and, more particularly, to a thin film transistor substrate capable of minimizing flickers or residual images in displaying images by a display device by stably applying a uniform common voltage to an entire surface of a thin film transistor substrate.

2. Description of the Related Art

Recently, flat panel display devices such as a liquid crystal display (LCD), a PDP (Plasma Display Panel), an OLED (Organic Light Emitting Device), an electrophoretic indication display), or the like, have been developed in place of a conventional CRT.

Among the flat panel display devices, the LCD is commonly used thanks to its advantages that it is thinner and lighter and consumes relatively less power compared with the CRT.

In general, the LCD is a device in which an arrangement state of liquid crystals is controlled by varying a generated field by a potential between two electrodes (pixel electrode and common electrode), and light transmittance is controlled according to the arrangement state of liquid crystals to thus display images. The LCD includes a liquid crystal panel that includes a color filter substrate having color filters, a thin film transistor (TFT) substrate having TFTs, and a liquid crystal layer positioned between the color filter substrate and the TFT substrate.

Figure 1:
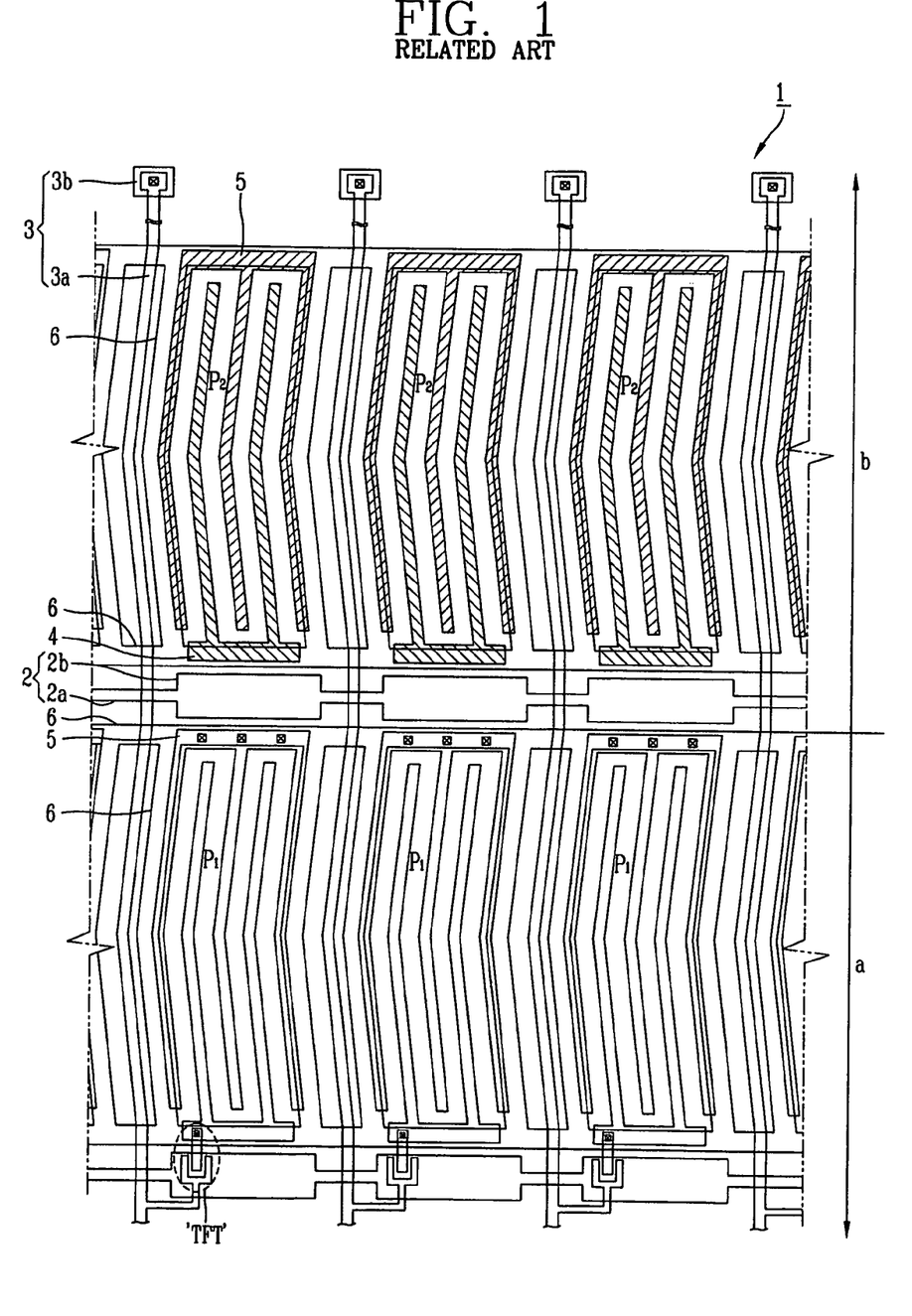
FIG. 1 is a view illustrating the structure of pixels formed at a thin film transistor (TFT) substrate according to the related art.

Here, the TFT substrate 1 includes a display area (a) for displaying an image and a non-display area (b) that does not display an image. The display area (a) includes a plurality of display pixels P1 formed in a matrix form to display an image, and the non-display area (b) includes dummy pixels P2 for maintaining a certain cell gap when the color filter substrate and the TFT substrate 1 are attached. Unlike the display pixels P1 positioned at the display area (a), the dummy pixels P2 do not have the TFT, not displaying an image, but have the same structure as that of the display pixels P1.

Here, as shown in FIG. 1, the TFT 1 includes gate wiring 2 and data wiring 3 formed to cross each other. The gate wiring 2 includes a gate line 2a extending generally in a horizontal direction, a gate pad (not shown) formed at an end portion of the gate line 2a, and a gate electrode 2b constituting the TFT as a portion of the gate line 2a. The gate electrode 2b may be formed with a larger width than the gate line 2a. The data wiring 3 includes a data line 3a extending generally in a vertical direction and a data pad 3b formed at an end of the data line 3a. A region where the gate line 2a and the data line 3a cross is defined as a pixel. For example, as shown in FIG. 1, a pixel having an IPS (in-Plane Switching) structure includes a pixel electrode 4 and a common electrode 5 that are alternately formed repeatedly. A common voltage line 6 is provided along edges of the pixel to apply a common voltage Vcom to the common electrode 5. The common voltage line 6 is mutually connected in an extending direction of the gate line 2a.

However, the common voltage Vcom applied to the common voltage line 6 is lowered (voltage drop) due to self-resistance of the common voltage line 6, causing a problem that the common voltage is not uniformly applied to the entire surface of the TFT substrate 1. The non-uniformity of the common voltage degrades picture quality such as residual images or flickers.

SUMMARY OF THE INVENTION

Therefore, in order to address the above matters the various features described herein have been conceived. One aspect of the exemplary embodiments is to provide a thin film transistor (TFT) substrate capable of minimizing flickers or residual images in displaying an image by a display device by stably applying a uniform common voltage to the entire surface of the TFT substrate.

This specification provides a TFT substrate including: a plurality of gate wirings; a plurality of data wirings insulatedly crossing the gate wirings to define a plurality of pixels; a plurality of common voltage lines formed along edges of pixels and mutually connected in an extending direction of the gate wirings; and a plurality of common electrodes formed at the pixel such that the plurality of common electrodes partially overlap with the common voltage line and mutually connected in an extending direction of the data wirings.

Here, each pixel may include a display pixel positioned at a display area where an image is formed, and a dummy pixel positioned at a non-display area other than the display area. Each common electrode may include a display part common electrode formed at the display pixel, a non-display part common electrode formed at the dummy pixel, and a common electrode connecting unit that connects the display part common electrode and the non-display part common electrode and the display part common electrodes.

The display part common electrode may include a first display part common electrode connected with the common voltage line via a common voltage contact hole, and a second display part common electrode extending along the data wiring from the first display part common electrode. The non-display part common electrode may be formed to cover the entire surface of the dummy pixel, and may be connected with the common voltage line via the common voltage contact hole.

The display part common electrode may include a first display part common electrode connected with the common voltage line via a common voltage contact hole, and a second display part common electrode extending along the data wiring from the first display part common electrode. The non-display part common electrode may include a first non-display part common electrode and a second non-display part common electrode which are respectively formed at both ends of the dummy pixel in an extending direction of the data wiring, and may be connected with the common voltage line via the common voltage contact hole.

The first non-display part common electrode may be formed to be adjacent to an end portion of the data wiring, the second non-display part common electrode may be formed to be adjacent to the display part common electrode, and the connection part common electrode may connect the second non-display part common electrode and the first display part common electrode which are positioned to be adjacent to each other.

The connection part common electrode may extend in the extending direction of the data wiring to partially overlap with the gate wiring.

The connection part common electrode may connect the display part common electrode and the non-display part common electrode which are positioned at respectively different pixels and mutually adjacent in the extending direction of the data wiring.

The connection part common electrode may connect the first display part common electrode and the second display part common electrode which are positioned at each different pixel and mutually adjacent in the extending direction of the data wiring.

The TFT substrate may further include a plurality of TFTs formed at respective crossings of the plurality of gate wirings and the plurality of data wirings, and the connection part common electrode may be formed along the data wiring so as to be adjacent to the data wiring that forms the TFT formed at an adjacent pixel.

The non-display part common electrodes may be mutually connected along the extending direction of the gate wirings.

The TFT substrate may further include pixel electrodes that form an in-plane field together with the display part common electrodes, and each pixel electrode may include a first pixel electrode formed to be adjacent to the gate wiring to overlap with the common voltage line at the display pixel and a second pixel electrode positioned between the second display part common electrodes such that the pixel electrodes alternately positioned together with the second display common electrode repeatedly.

The connection part common electrode may be formed not to overlap with the pixel electrode.

The TFT may further include a source electrode branched from the data wiring and a drain electrode separated from the source electrode and extending to be interposed between the common voltage line and the first pixel electrode. The pixel electrode may be connected with the drain electrode via a drain contact hole.

The common electrode and the pixel electrode may be made of one of ITO (Indium Tin Oxide) and IZO (Indium Zinc Oxide).

The dummy pixels may be provided at both ends of the data wiring.

The same common voltage as that of the common voltage line may be applied to the gate wiring defining the dummy pixel.

The connection part common electrode may be electrically connected with the overlapping gate wiring, so as to be provided with a common voltage.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3b is a sectional view taken along line IIIb-IIIb in FIG. 3a;

DETAILED DESCRIPTION OF THE INVENTION

The embodiments of the present invention will now be described in detail with reference to the accompanying drawings.

If a certain film (layer) is formed (positioned) on a different film (layer), it includes the case where the two films (layers) contact with each other and the case where a still different film (layer) exists between the two films (layers).

Figure 2:
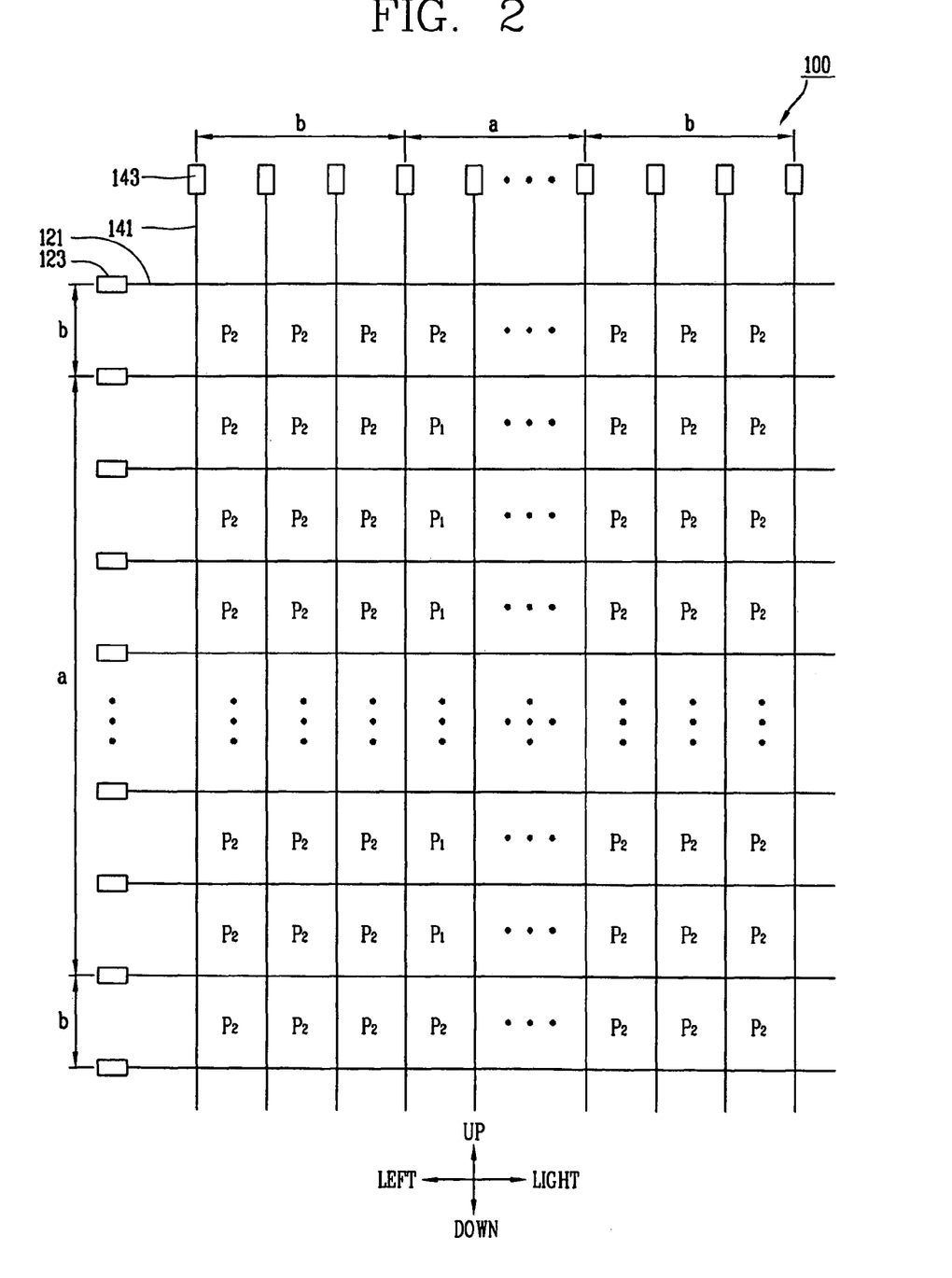
FIG. 2 is a layout view of a TFT substrate according to the present invention.
Figure 3A:
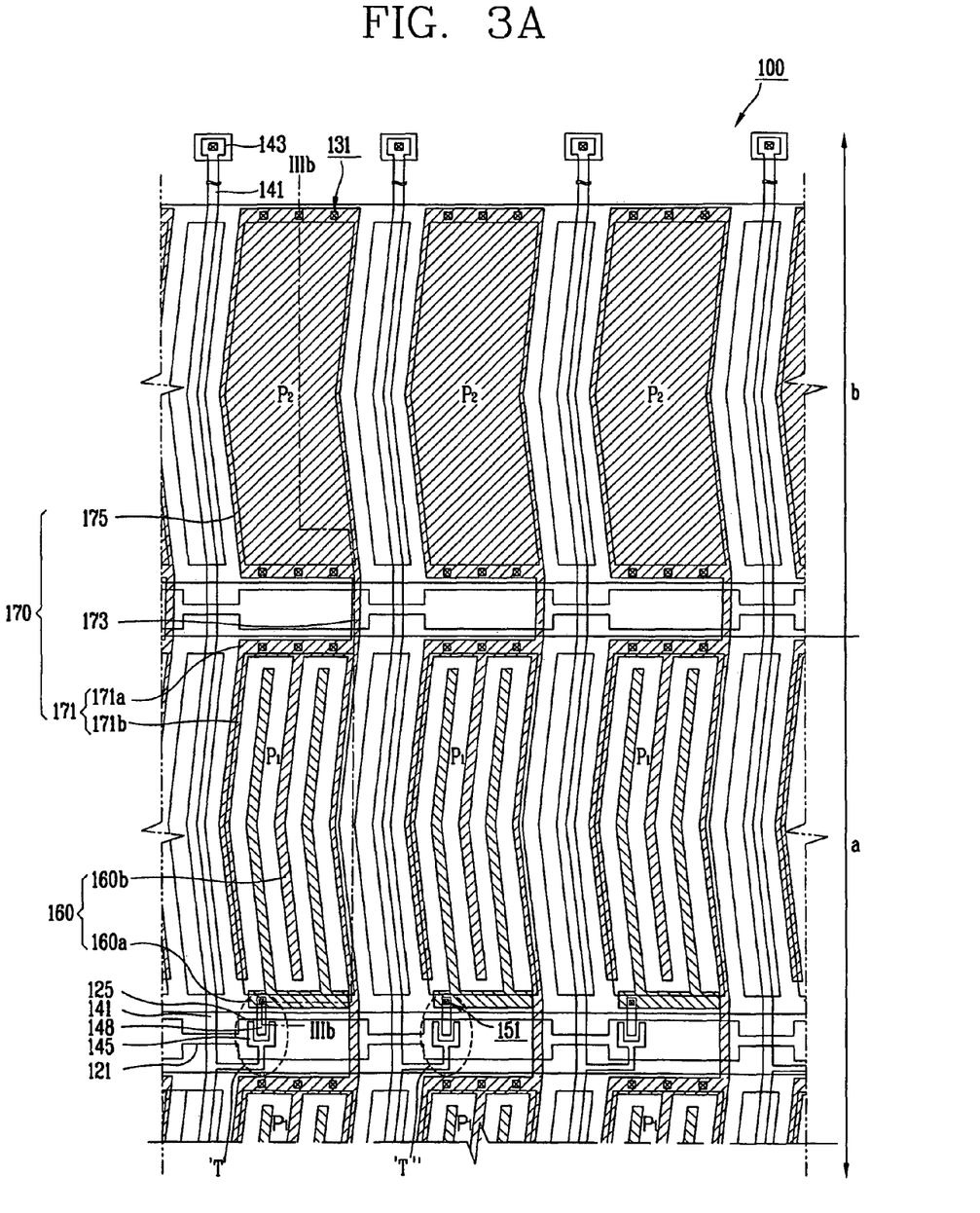
FIG. 3a is a view showing the structure of pixels formed at the TFT substrate according to a first embodiment of the present invention.
Figure 3B:
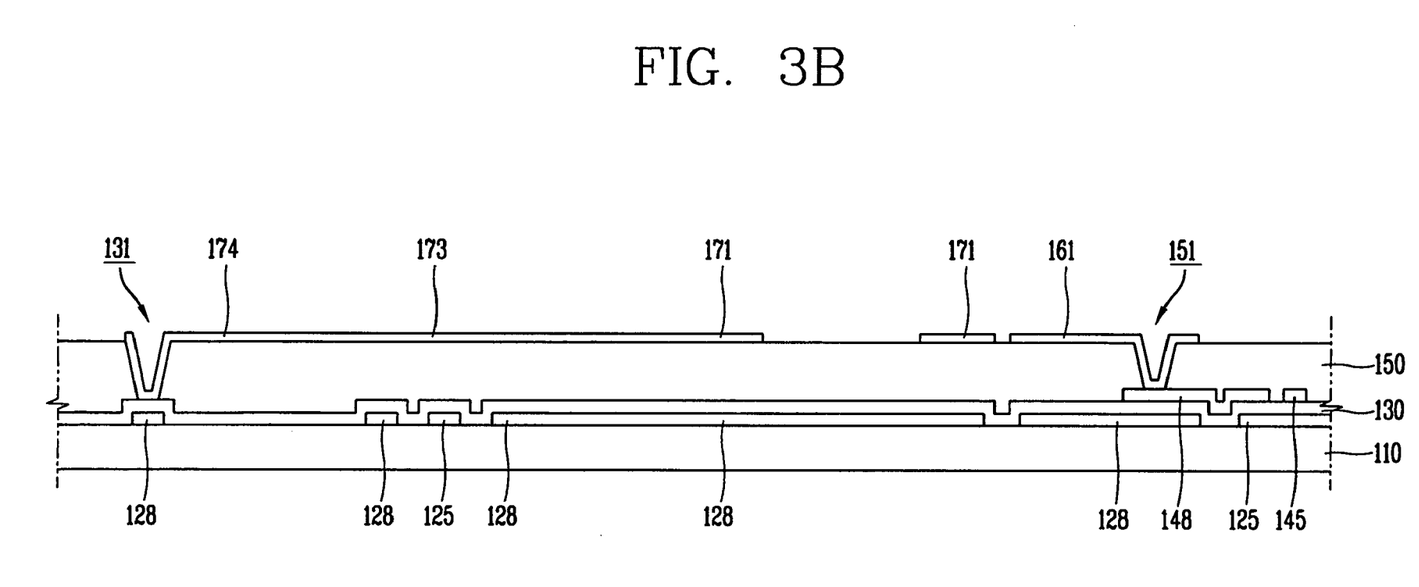

FIG. 2 is a layout view of a thin film transistor (TFT) substrate according to the present invention, FIG. 3a is a view showing the structure of pixels formed at the TFT substrate according to a first embodiment of the present invention, and FIG. 3b is a sectional view taken along line IIIb-IIIb in FIG. 3a.

In general, as shown in FIG. 2, a TFT substrate 100 includes a display region (a) where an image is formed and a non-display area. Generally, three pixels P2 are positioned at the left and right non-display areas (b), and one or more pixels P2 are positioned at upper and lower non-display areas (b). Namely, the pixels P1 positioned at the display area (a) are surrounded by the pixels P2 positioned at the non-display areas (b). The reason for forming the pixels P2 at the edges of the TFT substrate 100 is to uniformly maintain a cell gap when a color filter substrate and the TFT substrate are attached.

In particular, the reason of positioning three pixels P2 at left and right portions of the TFT substrate 100 is as follows. When three-color color filters are fabricated on the color filter substrate by using a single mask, the blue, green and red color filters are fabricated while sequentially moving the single mask in the leftward direction, so an extra space corresponding to the three pixels P2 is required at left and right portions of the fabricated color filter substrate. If the pixels P2 which are the same as the pixels P1 of the display area (a) are not provided at the region of the TFT substrate corresponding to the extra space provided on the color filter substrate, when the color filter substrate and the TFT substrate are attached, a gap between the both substrates would be different at each position. Then, the cell gap would not be uniform overall, degrading optical characteristics. Thus, in order to avoid such problem, the pixels P2 which are the same as the display region (a) are provided at left and right portions of the TFT substrate 100 so that when the color filter substrate and the TFT substrate are attached, the gap between the both substrates can be uniform at each position.

Here, the pixels P1 and P2 are defined by gate wirings 121 and 123 and data wirings 141 and 143 formed to cross each other. The pixels P1 positioned at the display area (a) are display pixels, and the pixels P2 positioned at the non-display area (b) are dummy pixels. Unlike the display pixel (P1) positioned at the display area (a), the dummy pixels P2 does not have a TFT, not displaying an image. In addition, the common electrode 170 of the dummy pixels P2 according to the present invention has a different shape as that of the display pixel P1. The structure of the dummy pixels P2 discriminated from the display pixels P1 will now be described with reference to FIGS. 3a and 3b.

As shown in FIGS. 3a and 3b, the TFT substrate 100 includes gate wirings 121, 123 and 125, a common voltage line 128, data wirings 141, 143, 145 and 148 crossing the gate wirings 121, 123 and 125, TFTs formed at crossings of the gate wirings 121, 123 and 125 and the data wirings 141, 143, 145 and 148, and a pixel electrode 160 and a common electrode 170 formed at each pixel defined as the gate wirings 121, 123 and 125 and the data wirings 141, 143, 145 and 148, all of which are formed on the insulation substrate 110.

The insulation substrate 110 is made of an insulation material such as glass, quartz, ceramic or plastic, etc.

The gate wirings 121, 123 and 125 include the gate line 121 extending in a horizontal direction, the gate pad 123 (see FIG. 2) connected with an end portion of the gate line 121, receiving a gate signal from the exterior and transferring the gate signal to the gate line 121, and the gate electrode 125 constituting the TFT as a part of the gate line 121. As shown in FIG. 3a, the gate electrode 125 may be formed as the width of the gate line 121 extends, or differently, the gate electrode 125 may be branched from the gate line 121.

The common voltage lines 128 are formed on the same layer on which gate wirings 121, 123 and 125 are formed. The common voltage lines 128 are formed along edges of the pixels P1 and P2 defined as the gate wirings 121, 123 and 125 and the data wirings 141, 143, 145 and 148 cross each other, and mutually connected along an extending direction of the gate line 121. The common voltage line 128 is connected with the common electrode 170 via a common voltage contact hole 131 and applies a common voltage to the common electrode 170. The common voltage lines 128 are made of the same material as that of the gate wirings 121, 123 and 125, but physically separated. The common voltage lines 128 formed at respective pixels P1 and P2 are connected in the extending direction of the gate line 121.

The gate wirings 121, 123 and 125 and the common voltage lines 128 may be formed as a metallic single layer or a multi-layer and may be made of molybdenum, manganese, tungsten, nickel, aluminum, chromium, gold, silver, their alloys, etc. The reason of forming the gate wirings 121, 123 and 125 and the common voltage lines 128 as multi-layer is to complement shortcomings of each metal or alloy and obtain desired physical properties.

The same common voltage as that of the common voltage lines 128 may be applied to the gate wirings 121, 123 and 125 defining the dummy pixels P2. This is because, the dummy pixels P2 are regions where an image is not formed, without having a TFT unlike the display pixels P1. In this case, the gate wirings 121, 123 and 125 defining the dummy pixels P2 are extra wirings which are not necessary. However, in the present invention, the common voltage Vcom is applied to the gate wirings 121, 123 and 125 defining the dummy pixels P2, and although not shown specifically, the gate wirings 121 and 125 and the connection part common electrode 173 come in contact with each other via a contact hole, to thereby stably transmit the common voltage to the common electrode 170.

A gate insulating layer 130 is formed on the gate wirings 121, 123 and 125 and the common voltage lines 128 and on portions of the insulation substrate 110 which are not covered by the gate wirings 121, 123 and 125 and the common voltage lines 128. The gate insulating layer 130 is an inorganic insulating layer made of silicon nitride (SiNx), silicon oxide (SiOx), etc. A common voltage contact hole 131 exposing a portion of the common voltage line 128 is formed on the gate insulating layer 130.

Although not shown, TFTs are formed at crossings of the gate wirings 121, 123 and 125 and the data wirings 141, 143, 145 and 148 at the display pixels P1. Namely, although not shown, a semiconductor layer and a resistor contact layer are sequentially stacked on the gate electrode 125. The semiconductor layer can be made of semiconductor such as amorphous silicon or polycrystalline silicon, etc. The resistor contact layer made of n+ hydrogenated amorphous silicon in which silicide or n type impurities are doped with high density is formed on the semiconductor layer.

The data wirings 141, 143, 145 and 148 include the data line 141 extending in one direction to cross the gate line 121 on the insulating layer 130, the data pad 143 provided at an end portion of the data line 141 and receiving a driving or control signal from the exterior, the source electrode 145 branched from the data line 141 and extending to the gate electrode 125, and the drain electrode 148 disposed to be separated from the source electrode 145 based on the gate electrode 123.

As shown in FIG. 3, the data line 141 may be formed to have a partially bent shape like a clamp-like (<) shape, and although not shown, the data line 141 may have a linear shape. The drain electrode 148 is separated from the source electrode 145, extends onto the common voltage line 128 adjacent to the gate electrode 125, and is interposed between the common voltage line 128 and a first pixel electrode 160a. Accordingly, the TFT (T) is fabricated.

The data wirings 141, 143, 145 and 148 may comprise as a material at least one of Al, Cr, Mo, Au, Pt, Pd and their alloys. The data wirings 141, 143, 145 and 148 may be formed as a single layer or multi-layer including at least one of the materials. The data lines 141 insulatedly cross the gate lines 121 to define the plurality of pixels (display pixels P1 and the dummy pixels P2. The region between the source electrode 145 and the drain electrode 148 on the gate electrode 125 is defined as a channel region.

The data wirings 141, 143, 145 and 148 corresponding to the general display pixels P1 have been described, and the data wirings 141 and 143 corresponding to the dummy pixels P2 do not include the source electrode 145 and the drain electrode 148. This is because the dummy pixels P2 are formed at the region where an image is not formed, so the TFT is not required. Thus, as shown in FIG. 3a, the source 145 and the drain electrode 148 are not formed on the gate electrode 125 corresponding to the dummy pixels P2.

A passivation film 150 is formed on the gate insulating layer 130 and the data wirings 141, 143, 145 and 148. A drain contact hole 151 exposing the drain electrode 148 is formed at the passivation film 150. The passivation film may be made of an organic insulation material and may contain, for example, acrylic polymer.

The pixel electrode 160 and the common electrode 170 are formed on the passivation film 150.

First, the pixel electrodes 160 are formed only at the display pixels P1 and are not formed at the dummy pixels P2. The pixel electrodes 160 formed at the display pixels P1 include first pixel electrodes 160a formed to be adjacent to the gate electrodes 125 to overlap with a portion of the common electrode lines 128 and second pixel electrodes 160b which separately extend along the data lines 141 from the first pixel electrodes 106a. The second pixel electrodes 160b have a partially bent shape like the data line 141 and are alternately positioned with second display part common electrodes 171b repeatedly.

The common electrodes 170 are formed at the pixels (display pixels P1 and the dummy pixels P2) such that they partially overlap with the common voltage lines 128, and each common electrode 170 include a display part common electrode 171 formed at the display part P1, a non-display part common electrode 175 formed at the dummy pixel P2, and a connection part common electrode 173 connecting the non-display part common electrode 165 and the display part common electrode 171 and the display part common electrodes 171.

The display part common electrode 171 includes a first display part common electrode 171a connected with the common voltage line 128 via the common voltage contact hole 131, and the second display part common electrode 171b extending along the data line 141 from the first display part common electrode 171a. The first display part common electrode 171a extends along the gate line 121 and receives the common voltage Vcom from the common voltage line 128. The second display part common electrode 171b is alternately formed with the second pixel electrode 160b repeatedly and forms an in-plane (horizontal) field together with the second pixel electrode 160b.

The non-display part common electrode 175 according to the first embodiment of the present invention is formed to cover the entire surface of the dummy pixels P2. Namely, the non-display part common electrode 175 is formed to have a considerably large width compared to the common voltage line 128 and the display part common electrode 171. In detail, the non-display part common electrode 175 is positioned to cover the interior of a space formed by the data line 141 and the gate line 121, and receives the common voltage Vcom from the common voltage line 128.

The connection part common electrode 173 extends in the extending direction of the data line 141 between the non-display part common electrode 165 and the display part common electrode 171 and between the display part common electrodes 171 and integrally connect the display part common electrode 171 and the non-display part common electrode 175 disposed in the extending direction of the data line 141. Namely, the connection part common electrode 173 connects the non-display part common electrode 165 and the display part common electrode 171 which are positioned at the different pixels (display pixels P1 and the dummy pixels P2) and mutually adjacent to each other in the extending direction of the data line 141, and also connects the display part common electrodes 171.

In detail, the connection part common electrode 173 formed between the dummy pixels P2 and the display pixels P1 which are adjacent to the data pad 143 connects the non-display part common electrode 174 and the first display part common electrode 171a. Although not shown, the connection part common electrode 173 formed between the dummy pixels P2 and the display pixels P1 provided at the opposite side of the data pad 143 connects the non-display part common electrode 175 and the second display part common electrode 171a. The connection part common electrode 173 connecting the display pixels P1 connects the first display part common electrode 171a and the second display part common electrode 171b. Here, the connection part common electrode 173 connecting the display pixels P1 is formed along the data line 141 so as to be adjacent to the data line 141 constituting the TFTs (T') formed at the adjacent display pixels P1.

The connection part common electrode 173 is formed to partially overlap with the gate wirings 121 and 125 and formed not to overlap with the pixel electrodes 160. As described above, this is to apply the common voltage Vcom also to the gate wirings 121, 123 and 125 defining the dummy pixels P2, and although not shown specifically, and stably transfer the common voltage to the common electrode 170 by allowing the gate wirings 121 and 125 and the connection part common electrode 173 (to be described) to contact with each other.

The common electrode 170 and the pixel electrode 160 are made of one of ITO and IZO. Namely, the common electrode 170 and the pixel electrode 160 are made of the same material.

The thusly formed common electrodes 170 are mutually connected in the direction of the data line 141. The common voltage lines 128 are mutually connected in the direction of the gate line 121. Accordingly, the common voltage Vcom flowing through the common voltage line 128 and the common electrode 170 is transferred like a mesh structure. Namely, in the related art, the common voltage Vcom flows only in the direction of the gate line 121 along the common voltage line 128, but according to the structure of the common electrodes 170, the common voltage Vcom can flow also in the direction of the data line 141. Accordingly, the deviation of the size of the common voltage Vcom flowing on the entire surface of the TFT substrate 100 can be minimized and the common voltage Vcom can be smoothly and stably supplied.

In particular, because the non-display part common electrode 175 having the extended width is formed at the dummy pixels P2 and the common voltage Vcom is applied to the non-display part common electrode 175 to allow the common voltage Vcom to be transferred to the display part common electrode 171, thereby considerably reducing resistance to the flowing of the common voltage Vcom. Accordingly, the deviation of the size of the common voltage Vcom applied to the plurality of display part common electrodes 171 and the deviation of the application time can be minimized. Thus, deficient picture quality such as residual images or flickers due to the imbalance of the common voltage can be minimized.

Figure 4:
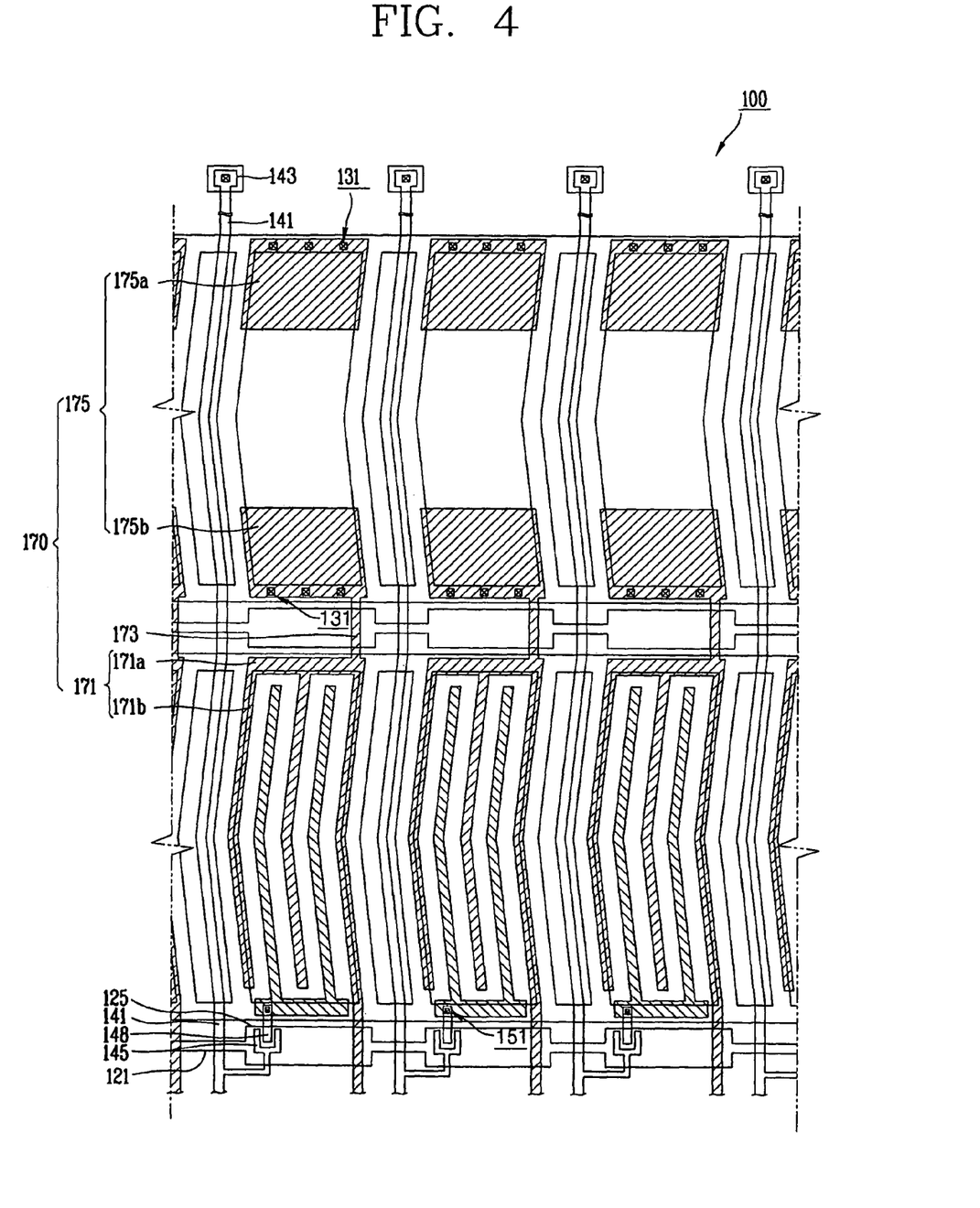
FIG. 4 is a view showing the structure of pixels formed at a TFT substrate according to a second embodiment of the present invention.

A TFT substrate according to the second embodiment of the present invention will now be described with reference to FIG. 4. In the second embodiment of the present invention, only the characteristic parts different from those of the first embodiment will be explained, and omitted description would follow the first embodiment of the present invention. For the sake of explanation, the same elements are given the same reference numerals.

The non-display part common electrode 175 according to the second embodiment of the present invention includes a first non-display part common electrode 175a and a second non-display part common electrode 175b which are respectively formed at both ends of the dummy pixels P2 in the extending direction of the data line 141. In this case, the connection part common electrode 173 connects the second non-display part common electrode 175b and the first display part common electrode 171a which are positioned to be mutually adjacent.

The second embodiment of the present invention is a modification in which the non-display part common electrodes are not integrally formed unlike those in the first embodiment of the present invention. In the second embodiment, the width of the non-display part common electrode 175 extends and the common voltage flows like the mesh structure, so that the common voltage imbalance on the entire surface of the TFT substrate 100 can be minimized.

A TFT substrate according to the third embodiment of the present invention will now be described with reference to FIG. 5. In the third embodiment of the present invention, only the characteristic parts different from those of the first embodiment will be explained, and omitted description would follow the first embodiment of the present invention. For the sake of explanation, the same elements are given the same reference numerals.

Figure 5:
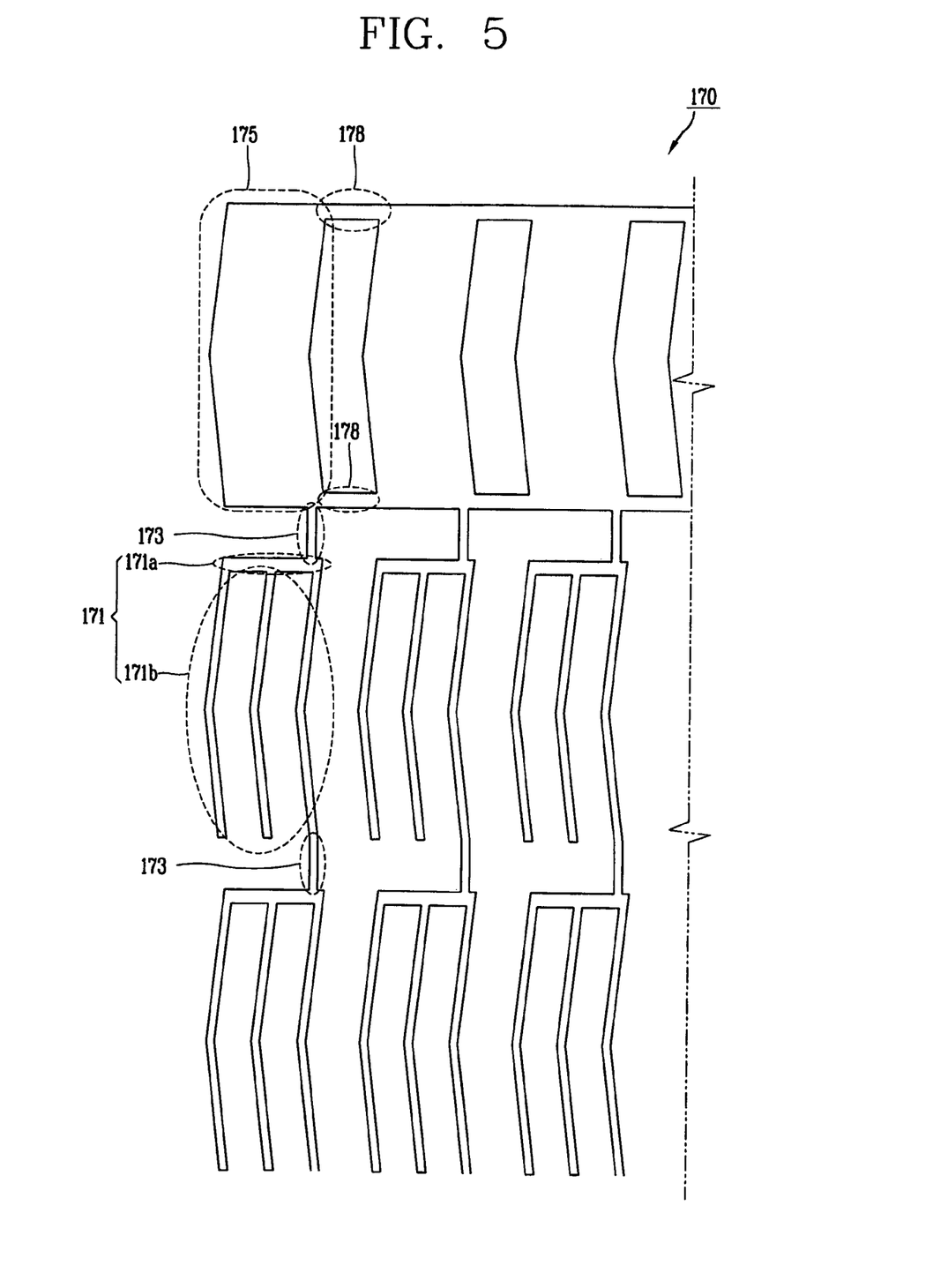
FIG. 5 is a view showing the configuration of common electrodes according to a third embodiment of the present invention.

FIG. 5 illustrates only the common electrode 170 according to the third embodiment of the present invention. The common electrode 170 according to the third embodiment includes a connection pattern 178 unlike the first embodiment. Namely, the common electrode 170 includes the connection pattern 178 connecting the non-display part common electrodes 175 in the extending direction of the gate line 121 (See FIG. 3a).

Accordingly, the common voltage Vcom can flow more stably in the direction of the gate line 121 with a minimized voltage drop. Thus, a common voltage imbalance on the entire surface of the TFT substrate 100 can be minimized.

As so far described, the TFT substrate according to the present invention has such an advantage that because the uniform common voltage is stably applied to the entire surface of the TFT substrate, flickers or residual images can be minimized when an image is displayed on the display device.

As the present invention may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A thin film transistor substrate comprising:
    a plurality of gate wirings;
    a plurality of data wirings insulatedly crossing the gate wirings;
    a plurality of pixels defined by the gate wirings and the data wirings to cross each other;
    a plurality of common voltage lines formed along edges of pixels and mutually connected in an extending direction of the gate wirings; and
    a plurality of common electrodes formed at the pixel such that the plurality of common electrodes partially overlap with the common voltage line and mutually connected in an extending direction of the data wirings, wherein each pixel comprises a display pixel positioned at a display area where an image is formed, and a dummy pixel positioned at a non-display area other than the display area, and each common electrode comprises a display part common electrode formed at the display pixel, a non-display part common electrode formed at the dummy pixel, wherein the non-display part common electrode is formed to cover the entire surface of the dummy pixel, and a common electrode connecting unit that connects the display part common electrode with the non-display part common electrode.

2. The substrate of claim 1, wherein the display part common electrode comprises a first display part common electrode connected with the common voltage line via a common voltage contact hole, and a second display part common electrode extending along the data wiring from the first display part common electrode, and is connected with the common voltage line via the common voltage contact hole.

3. The substrate of claim 2, wherein the common electrode connecting unit connects the first display part common electrode and the second display part common electrode which are positioned at each different pixel and mutually adjacent in the extending direction of the data wiring.

4. The substrate of claim 3, further comprising:
    a plurality of TFTs formed at respective crossings of the plurality of gate wirings and the plurality of data wirings, and the common electrode connecting unit is formed along the data wiring so as to be adjacent to the data wiring that forms the TFT formed at an adjacent pixel.

5. The substrate of claim 2, further comprising:
    pixel electrodes that form an in-plane field together with a display part common electrodes, and each pixel electrode comprises a first pixel electrode formed to be adjacent to the gate wiring to overlap with the common voltage line at the display pixel and a second pixel electrode positioned between the second display part common electrodes such that the pixel electrodes alternately positioned together with a second display common electrode repeatedly.

6. The substrate of claim 5, wherein the common electrode connecting unit is formed not to overlap with the pixel electrode.

7. The substrate of claim 5, wherein the TFT further comprises a source electrode branched from the data wiring and a drain electrode separated from the source electrode and extending to be interposed between the common voltage line and the first pixel electrode, and the pixel electrode is connected with the drain electrode via a drain contact hole.

8. The substrate of claim 5, wherein the common electrode and the pixel electrode are made of one of ITO (Indium Tin Oxide) and IZO (Indium Zinc Oxide).

9. The substrate of claim 1, wherein a same common voltage as that of the common voltage line is applied to the gate wiring defining the dummy pixel.

10. The substrate of claim 9, wherein the common electrode connecting unit is electrically connected with an overlapping gate wiring, so as to be provided with a common voltage.

* * * * *